United States Patent
Shokrollahi et al.

(10) Patent No.: US 6,631,172 B1
(45) Date of Patent: Oct. 7, 2003

(54) EFFICIENT LIST DECODING OF REED-SOLOMON CODES FOR MESSAGE RECOVERY IN THE PRESENCE OF HIGH NOISE LEVELS

(75) Inventors: Mohammad Amin Shokrollahi, Hoboken, NJ (US); Vadim Olshevsky, Marietta, GA (US)

(73) Assignee: Lucent Technologies Inc., Murray Hill, NJ (US)

(*) Notice: Subject to any disclaimer, the term of this patent is extended or adjusted under 35 U.S.C. 154(b) by 0 days.

(21) Appl. No.: 09/563,602

(22) Filed: May 1, 2000

(51) Int. Cl.[7] .................................. H03D 1/00
(52) U.S. Cl. ...................... 375/340; 714/784
(58) Field of Search ................... 375/340, 341, 375/262, 346; 714/784, 756; 708/492

(56) References Cited

U.S. PATENT DOCUMENTS

| | | | |
|---|---|---|---|
| 4,276,646 A | 6/1981 | Haggard et al. | 714/755 |
| 4,633,470 A | 12/1986 | Welch et al. | 714/781 |
| 5,535,140 A | 7/1996 | Iwamura | 701/99 |
| 5,600,659 A | 2/1997 | Chen | 714/752 |
| 5,642,367 A | 6/1997 | Kao | 714/784 |
| 5,818,854 A | 10/1998 | Meyer | 714/785 |
| 5,822,336 A | 10/1998 | Weng et al. | 714/784 |
| 5,944,848 A | 8/1999 | Huang | 714/784 |
| 6,199,188 B1 * | 3/2001 | Shen et al. | 714/782 |
| 6,317,858 B1 * | 11/2001 | Cameron | 714/785 |
| 6,345,376 B1 * | 2/2002 | Cox et al. | 714/785 |
| 6,357,030 B1 * | 3/2002 | Demura et al. | 714/755 |
| 6,449,746 B1 * | 9/2002 | Truong et al. | 714/784 |

OTHER PUBLICATIONS

Gui–Liang Feng and T.R.N. Rao "Decoding Algebraic–Geometric Codes up to the Designed Minimum Distance" IEEE Transactions on Information Theory, vol. 39, No. 1, Jan. 1993.

M. Amin Shokrollahi, et al., "List Decoding of Algebraic–Geometric Codes" Decoding AG–Codes.

Madhu Sudan, "Decoding of Reed Solomon codes beyond the error–correction bound".

* cited by examiner

Primary Examiner—Emmanuel Bayard

(57) ABSTRACT

A method and apparatus for efficient list decoding of Reed-Solomon error correction codes. A polynomial for a predetermined target list size combining points of an error code applied to a message and points of a received word is determined for a k dimensional error correction code by a displacement method. The displacement method finds a nonzero element in the kernel of a structured matrix which determines the polynomial. From roots of the polynomial, it is determined if the number of errors in the code word is smaller than a predetermined number of positions for generating a list of candidate code words meeting the error condition. In one embodiment, parallel processing is used for executing the displacement method. The invention will be more fully described by reference to the following drawings.

36 Claims, 5 Drawing Sheets

FIG. 3

```
         ┌─────────────────────────┐
         │         INPUT           │─31
         └────────────┬────────────┘
                      ▼
         ┌─────────────────────────────────┐
         │ COMPUTE MATRIX G WHICH IS A     │
         │ MEMBER OF                       │─32
         │         GF(q)^(m×r)             │
         └────────────┬────────────────────┘
                      ▼
         ┌─────────────────────────────────┐
         │ COMPUTE MATRIX B WHICH IS A     │
         │ MEMBER OF                       │─33
         │         GF(q)^(r×(m+1))         │
         └────────────┬────────────────────┘
                      ▼
         ┌─────────────────────────────────────┐
         │ APPLY DISPLACEMENT METHOD 50 TO     │
         │ INPUT m,r,1/x_1,...,1/x_m,G, B TO   │─34
         │ DETERMINE VECTOR v                  │
         └────────────┬────────────────────────┘
                      ▼
         ┌─────────────────────────────────────┐
         │ TRANSFORM VECTOR v INTO POLYNOMIAL  │─35
         │         h(x,y)=z                    │
         └─────────────────────────────────────┘
```

FIG. 4

```
FOR i := 1 TO m DO
    g_i1 := 1/x_i   }─40              SET FIRST ELEMENT OF ROW i
    x := 1
    FOR j := 1 TO d_1 - 1 DO  }
        x := x * x_i          }─41    COMPUTE x_i^(d_i - 1)
    y := 1                            USED TO COMPUTE y_i^(j-2) EFFICIENTLY
    FOR j := 2 TO r DO ─42
        FOR l := 1 TO d_j - d_(j-1) DO  }─43   COMPUTE x_i^(d_i - 1)
            x := x * x_i                }
        y_ij := y * (y_i/x_i - x) ─44          COMPUTE g_ij y := y * y_i ─45                       UPDATE y
```

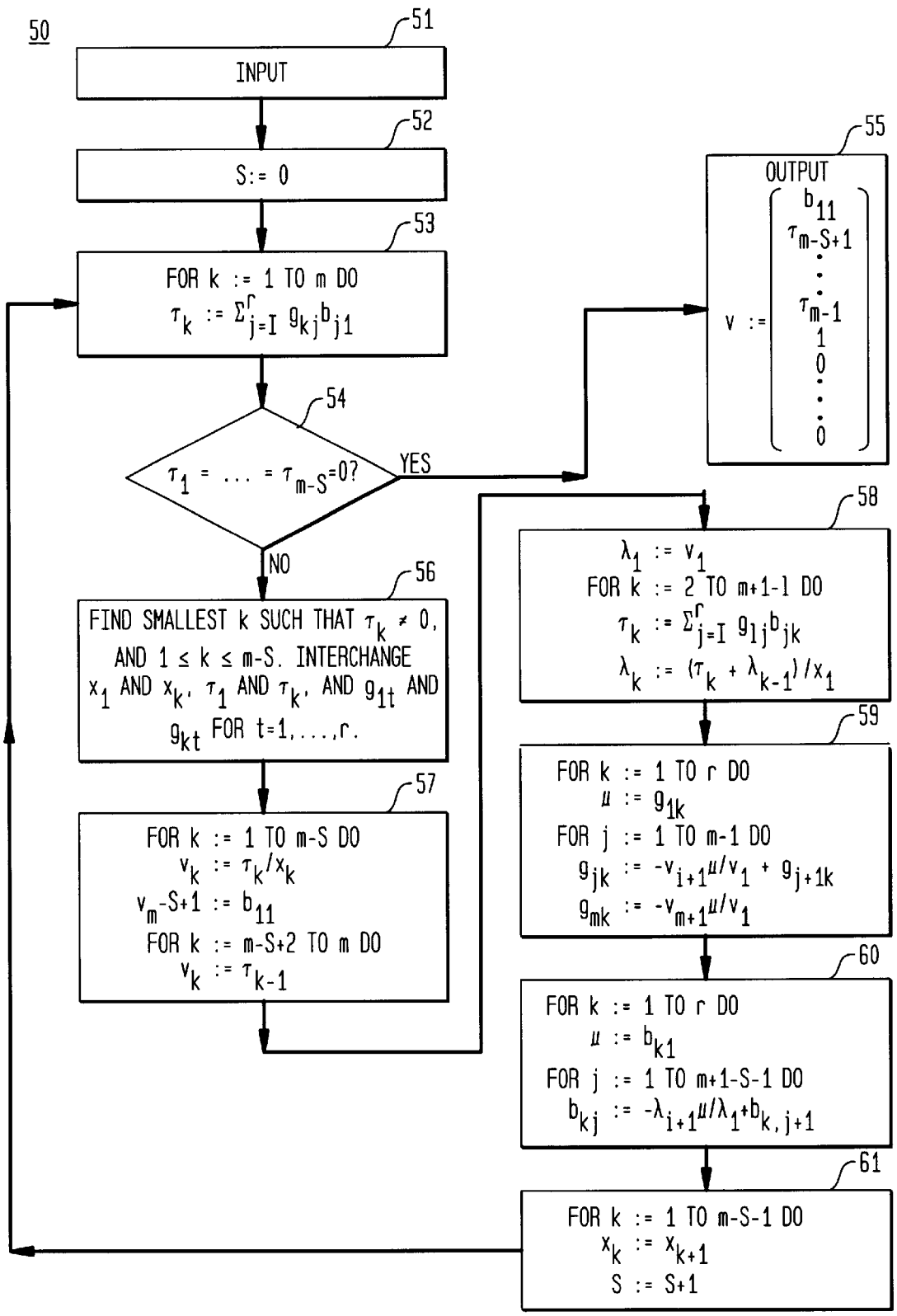

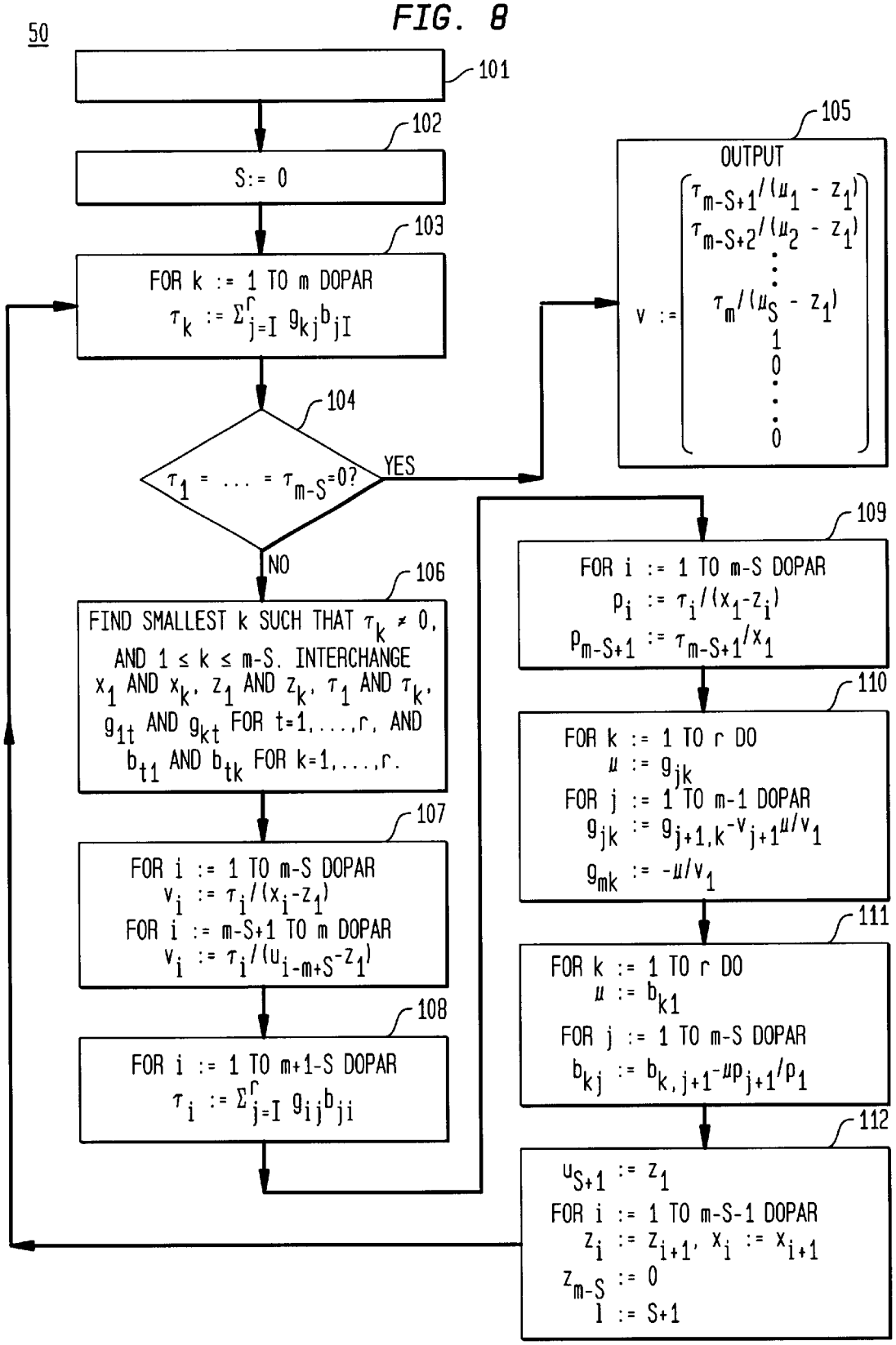

EFFICIENT LIST DECODING OF REED-SOLOMON CODES FOR MESSAGE RECOVERY IN THE PRESENCE OF HIGH NOISE LEVELS

FIELD OF THE INVENTION

The present invention relates to a method for efficient list decoding of Reed Solomon codes and sub-codes thereof

BACKGROUND OF THE INVENTION

Algebraic geometric (AG) codes utilizing the algebraic curve theory have been developed. Reed Solomon (RS) codes are well known as a subclass of error correction AG codes for correcting errors produced in a communication channel or a storage medium at the reception side in a digital communication system and a digital storage system. The codes have been used for example in devices which deal with compact disc and satellite communication systems.

Reed-Solomon codes are defined in terms of Galois or finite field arithmetic. Both the information and the redundancy portions of such codes are viewed as consisting of elements taken from some particular Galois field. A Galois field is commonly identified by the number of elements which it contains. The elements of a Galois field may be represented as polynomials in a particular primitive field element, with coefficients in the prime subfield. The location of errors and the true value of the erroneous information elements are determined after constructing certain polynomials defined on the Galois field and finding the roots of these polynomials. Since the number of elements contained in a Galois field is always equal to a prime number, q, raised to a positive integer power, m, the notation, $GF(q^m)$ is commonly used to refer to the finite field containing $q^m$ elements. In such a field all operations between elements comprising the field, yield results which are each elements of the field.

Decoding methods for RS and AG codes have been described, for example, decoding methods have been described which decode RS codes and AG codes up to a designed error correction bound, such as the error-correction bound (d−1)/2 of the code in which d is the minimum distance of the code. See G. L. Feng and T. R. N. Rao, "Decoding Algebraic-geometric Codes up to the Designed Minimum Distance," IEEE Trans. Inform. Theory, 39:37–45, 1993.

List decoding algorithms have been developed to provide decoding of RS codes beyond the error correction bound. Given a received encoded word and an integer l, this algorithm returns a list of a size at most l of codewords which have distance at most e from the received word, where e is a parameter depending on l and the code. See M. Sudan, "Decoding of Reed-Solomon Codes Beyond the Error-correction Bound," J. Compl., 13:180–193, 1997. List decoding has been extended to AG codes using an interpolation scheme and factorization of polynomials over algebraic function fields in polynomial time. See M. A. Shokrollahi and H. Wasserman, "List Decoding of Algebraic-geometric Codes", IEEE Trans. Inform. Theory, 45:432–437, 1999. The list decoding process for AG codes consists of a first step of computing a non-zero element in the kernel of a certain matrix and a second step of a root finding method. It is desirable to provide an improved method for efficient list decoding of RS codes and subcodes thereof.

SUMMARY OF THE INVENTION

The present invention relates to a method and apparatus for efficient list decoding of Reed-Solomon error correction codes. A polynomial for a predetermined target list size combining points of an error code applied to a message and points of a received word is determined for a k dimensional error correction code by a displacement method. The displacement method finds a nonzero element in the kernel of a structured matrix which determines the polynomial. From roots of the polynomial, it is determined if the number of errors in the code word is smaller than a predetermined number of positions for generating a list of candidate code words meeting the error condition. In one embodiment, parallel processing is used for executing the displacement method. The invention will be more fully described by reference to the following drawings.

BRIEF DESCRIPTION OF THE DRAWINGS

FIG. 3 illustrates a flow diagram for determining a polynomial h(x, y).

FIG. 4 is a flow diagram for computing a matrix $G \epsilon GF(q)^{m \times r}$.

FIG. 5 is a flow diagram of a displacement method.

FIG. 8 is a flow diagram of a displacement method for parallel processing.

DETAILED DESCRIPTION

Figure 1:
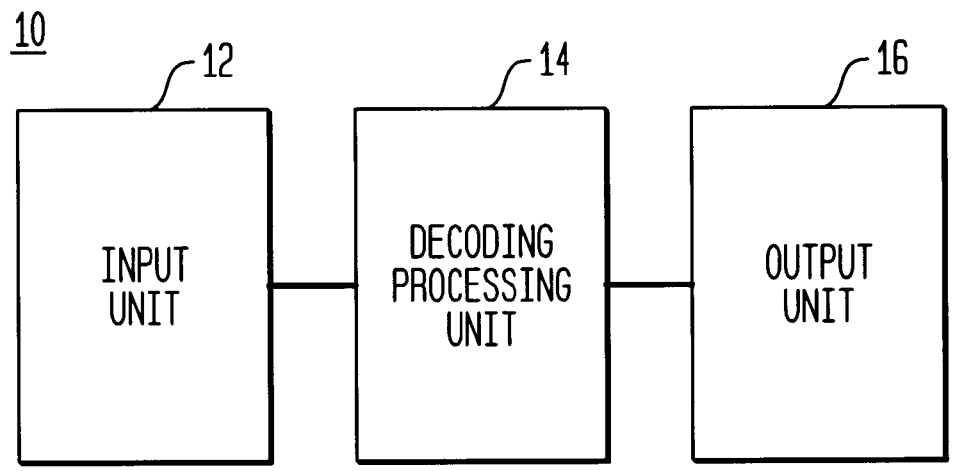
FIG. 1 illustrates a schematic diagram of the configuration of an apparatus for decoding Reed-Solomon error correcting codes 10.

Reference will now be made in greater detail to a preferred embodiment of the invention, an example of which is illustrated in the accompanying drawings. Wherever possible, the same reference numerals will be used throughout the drawings and the description to refer to the same or like parts.

FIG. 1 illustrates a schematic diagram of an apparatus for decoding error correction codes 10. The error correction codes can be Reed-Solomon codes and subcodes thereof. Input unit 12 includes a reception device for receiving data from for example a satellite broadcast or a communication network, a reading circuit for reading data from a storage medium such as a CD (compact disc) and received words input corresponding to image data or voice data. Decoding processing unit 14 decodes the received words input to input unit 12. Output unit 16 outputs decoded data and can include a display for displaying image data, a speaker for outputting decoded voice data, and the like.

A decoding procedure of a Reed Solomon (RS) code C can be used in decoding processing unit 14. In this decoding procedure, the code word received at input unit 12 is represented by a k-dimensional Reed-Solomon code C corresponding to a set of points $(x, \ldots, x_m)$ in a Galois field GF(q) represented by the set of all vectors of the form $(f(x_1), \ldots, f(x_m))$ where f ranges over all polynomials of degree less than k with coefficients in GF(q). The decoding procedure is a list decoder of distance e for the RS code C which takes as input any m dimensional vector $(y_1, \ldots, y_m)$ of a received word with coefficients in GF(q) and outputs all vectors in RS code C which differ in at most e positions from $(y_1, \ldots, y_m)$. A list decoder can be designed given target list size l, and the vector $(y_1, \ldots, y_m)$, from a polynomial $h(x, y) = h_1(x) + h_2(x)y + \ldots + h_{l+1}(x)y^l$ such that $h(x_i, y_i) = 0$ for all $i = 1, \ldots, m$, and $\deg(h_i(x)) < b - (i-1)k$ where b is the smallest integer that is larger than $$\frac{m}{l+1} + \frac{lk}{2}.$$

Accordingly, any Reed-Solomon vector $(f(x_1), \ldots, f(x_m))$ which differs from $(y_1, \ldots, y_m)$ in at most $$e := \frac{ml}{l+1} + \frac{lk}{2} - 1$$

positions has the property that $h(x, f(x)) = 0$.

Figure 2:
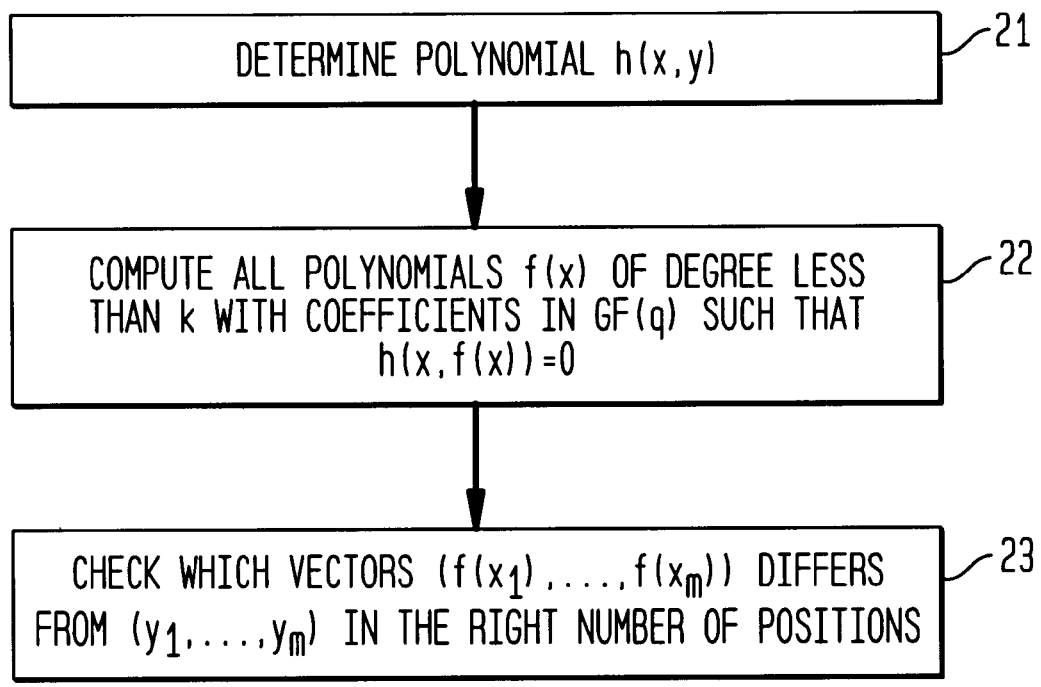
FIG. 2 is a flowchart illustrating a decoding procedure of a decoding processing unit used in the apparatus of FIG. 1.

FIG. 2 illustrates a flow diagram of a decoding procedure of the k-dimensional Reed-Solomon code C. In step 21, the polynomial $$h(x, y) = \sum_{i=1}^{l=1} h_i(x) y^{i-1}$$

is constructed from input of positive integers target list size l and k, vectors $(x_1, \ldots, x_m)$ and $(y_1, \ldots, y_m)$ with entries in GF(q) such that the $x_i$ are pairwise distinct and nonzero by a displacement method described below and $1 \leq k \leq m-1$.

FIG. 3 illustrates a flow diagram of a method for implementation of step 21. Step 31 applies input comprising points $(x_1, y_1), \ldots, (x_m, y_m)$ over GF(q) where the $x_i$ are pairwise distinct and nonzero, and integers $d_1, d_2, \ldots, d_r$ such that $$\sum_{i=1}^{r} d_i = m + 1$$

Step 32 computes matrix $G = (g_{ij}) \in GF(q)^{m \times r}$ wherein $r = l + 1$. FIG. 4 illustrates a flow diagram for the implementation of step 32. In step 40, the first element of row i is determined. In step 41, $x_i^{d_1-1}$ is computed. In step 42 $y_i^{i-2}$ is computed. In step 43, $x_i^{d_j-1}$ is computed. In step 44, $g_{ij}$ is computed. In step 45, y is updated. Steps 41–45 are repeated to m. Accordingly, the output is the matrix:

$$G = (g_{ij}) = \begin{pmatrix} 1/x_1 & y_1/x_1 - x_1^{d_1-1} & \cdots & y_1^{r-2}(y_1/x_1 - x_1^{d_r-1-1}) \\ 1/x_2 & y_2/x_2 - x_2^{d_1-1} & \cdots & y_2^{r-2}(y_2/x_2 - x_2^{d_r-1-1}) \\ \vdots & \vdots & \ddots & \vdots \\ 1/x_m & y_m/x_m - x_m^{d_1-1} & \cdots & y_m^{r-2}(y_m/x_m - x_m^{d_r-1-1}) \end{pmatrix} \quad (1)$$

Referring to FIG. 3, in step 33, the matrix $B = (b_{ij}) \in GF(q)^{r \times m+1}$ is computed, where $b_{ij} = 1$ if $j = d_1 + \ldots + d_{i-1} + 1$, and $b_{ij} = 0$, otherwise as $$B = \left( \begin{array}{cccc|cccc|c|cccc|cccc} 1 & 0 & 0 & \cdots & 0 & 0 & 0 & 0 & \cdots & 0 & & 0 & 0 & 0 & \cdots & 0 & 0 & 0 & 0 & \cdots & 0 \\ 0 & 0 & 0 & \cdots & 0 & 1 & 0 & 0 & \cdots & 0 & & 0 & 0 & 0 & \cdots & 0 & 0 & 0 & 0 & \cdots & 0 \\ 0 & 0 & 0 & \cdots & 0 & 0 & 0 & 0 & \cdots & 0 & & 0 & 0 & 0 & \cdots & 0 & 0 & 0 & 0 & \cdots & 0 \\ \vdots & \vdots & \vdots & \ddots & \vdots & \vdots & \vdots & \vdots & \ddots & \vdots & \cdots & \vdots & \vdots & \vdots & \ddots & \vdots & \vdots & \vdots & \vdots & \ddots & \vdots \\ 0 & 0 & 0 & \cdots & 0 & 0 & 0 & 0 & \cdots & 0 & & 1 & 0 & 0 & \cdots & 0 & 0 & 0 & 0 & \cdots & 0 \\ 0 & 0 & 0 & \cdots & 0 & 0 & 0 & 0 & \cdots & 0 & & 0 & 0 & 0 & \cdots & 0 & 1 & 0 & 0 & \cdots & 0 \end{array} \right) \quad (2)$$

$$\underbrace{\phantom{xxxx}}_{d_1} \underbrace{\phantom{xxxx}}_{d_1} \underbrace{\phantom{xxxx}}_{d_{r-1}} \underbrace{\phantom{xxxx}}_{d_r}$$

In step 34, a displacement method is applied for the input m, r, $1/x_1, \ldots, 1/x_m$, G, B to determine an output vector represented as $v := (v_1, v_2, \ldots, v_{m+1})^T$. The objective is to compute a polynomial $$h(x, y) = \sum_{i=1}^{r} h_i(x) y^{i-1}$$

such that $\deg(h_i(x)) < d_i$ and $h(x_i, y_i) = 0$ for $i = 1, \ldots, m$. This problem can be phrased as that of computing an element in the kernel of a certain matrix.

In general, the task solved by the displacement method is the following: if V is a matrix over the field GF(q) having m rows and m+1 columns, given as the solution to the equation:

$$\underbrace{\begin{pmatrix} x_1 & 0 & \cdots & 0 \\ 0 & x_2 & \cdots & 0 \\ \vdots & \vdots & \ddots & \vdots \\ 0 & 0 & \cdots & x_m \end{pmatrix}}_{=D} \cdot V - V \cdot \underbrace{\begin{pmatrix} 0 & 1 & 0 & \cdots & 0 \\ 0 & 0 & 1 & \cdots & 0 \\ \vdots & \vdots & \vdots & \ddots & \vdots \\ 0 & 0 & 0 & \cdots & 1 \\ 0 & 0 & 0 & \cdots & 0 \end{pmatrix}}_{=Z} = G \cdot B, \quad (3)$$

where the $x_i$ are pairwise different and nonzero elements of GF(q), then a nonzero vector v is determined such that $V \cdot v = 0$. It is assumed that the only nonzero entry in the first row of B is the (1,1)-entry.

The following space efficient variant can be as used in the displacement method: The matrix $$\bar{V} := \begin{pmatrix} V \\ I \end{pmatrix},$$

where I is the (m+1)×(m+1)-identity matrix, has the displacement structure $$\begin{pmatrix} D & 0 \\ 0 & A \end{pmatrix} \bar{V} - \bar{V} \cdot Z = \begin{pmatrix} G \\ C \end{pmatrix} B \quad (4)$$

where $$A = \begin{pmatrix} 0 & 1 & 0 & \cdots & 0 \\ 0 & 0 & 1 & \cdots & 0 \\ \vdots & \vdots & \vdots & \ddots & \vdots \\ 0 & 0 & 0 & \cdots & 1 \\ 1 & 0 & 0 & \cdots & 0 \end{pmatrix} \text{ and } C = \begin{pmatrix} 0 & 0 & 0 & \cdots & 0 \\ 0 & 0 & 0 & \cdots & 0 \\ \vdots & \vdots & \vdots & \ddots & \vdots \\ 0 & 0 & 0 & \cdots & 0 \\ 1 & 0 & 0 & \cdots & 0 \end{pmatrix}. \quad (5)$$

Applying the displacement method to $\overline{V}$ then recovers in an iterative fashion matrices $D_s$, $Z_s$, $C_s$, $G_s$, and $B_s$, s=0, 1, . . . , such that $$\begin{pmatrix} D_s & 0 \\ 0 & A \end{pmatrix} \overline{V}_s - \overline{V}_s \cdot Z_s = \begin{pmatrix} G_s \\ C_s \end{pmatrix} B_s \quad (6)$$

where $\overline{V}_s$ is the Schur-complement of the matrix $\overline{V}_{s-1}$ with respect to the (1,1)-entry.

FIG. 5 is a flow diagram illustrating a displacement method 50 which can be used to determine a nonzero element in the kernel of matrix V. In step 51, input is applied as positive integers, m, r, pairwise distinct nonzero elements $(x_1, \ldots, x_m)$ in GF(q), matrices $G=(g_{ij}) \in GF(q)^{m \times r}$ and $B=(b_{ij}) \in GF(q)^{r \times (m+1)}$, such that the only nonzero entry in the first row of B is the (1,1)-entry.

In step 52, an integer index s is set to zero. In step 53, a loop from k=1 to m is performed to determine vector $\tau_k$ representing a first column of the matrix. In step 54, it is determined if the first m-s entries are equal zero. If the result of step 54 is affirmative, step 55 is performed and a nonzero vector $v \in GF(q)^{m+1}$ such that $V \cdot v=0$ for the matrix V is outputted. The output vector v is given as $(c_{m-s+1}, \ldots, c_m, 1, 0, \ldots, 0)^T$, where $c_{m-s+1}, \ldots, c_m$ are entries m-s+1, . . . , m of the first column of $\overline{V}_s$. Because of the special structure of the matrices involved, $c_{m-s+1}$ is the (1,1)-entry of the matrix $B_s$, and the remaining c's equal the $\tau$'s. If the result of step 54 is negative, such that the first m-s entries of the first column of $\overline{V}_s$ are not all zero, pivoting is performed in step 56 to exchange the first entry with the first nonzero entry, among the first m-s entries of the first column, as represented as the $k^{th}$ entry wherein $1 \leq k \leq m-s$. Specifically, $x_1$ and $x_k$, $\tau_1$ and $\tau_k$ and $g_{1t}$ and $g_{kt}$ are interchanged for t=1, . . . , r. This corresponds to a multiplication of $\overline{V}_s$ with a permutation matrix, which results in exchanging the first and the $k^{th}$ row of $G_s$ and exchanging the first and $k^{th}$ diagonal entries of $D_s$.

Step 57 computes the first column of $\overline{V}_s$. Step 58 computes the first row of $\overline{V}_s$ for recovering the matrices $G_{s-1}$ and $B_{s-1}$. Steps 59 and 60 then update the matrices $G_{s+1}$ and $B_{s+1}$ using the elimination step of the displacement approach. Step 61 updates $D_{s+1}$ by deleting its (1,1)-entry and increases index s. Step 61 returns to step 53.

Accordingly, if $h_i(x):=h_{i0}+h_{i1}x+ \ldots +h_{i,d_i-1}x^{d_i-1}$, $V \cdot v=0$, where $$V := \begin{pmatrix} 1 & x_1 & \cdots & x_1^{d_1-1} & y_1 & y_1 x_1 & \cdots & y_1 x_1^{d_2-1} & \cdots & y_1^{r-1} & y_1^{r-1} x_1 & \cdots & y_1^{r-1} x_1^{d_r-1} \\ 1 & x_2 & \cdots & x_2^{d_1-1} & y_2 & y_2 x_2 & \cdots & y_2 x_2^{d_2-1} & \cdots & y_2^{r-1} & y_2^{r-1} x_2 & \cdots & y_2^{r-1} x_2^{d_r-1} \\ \vdots & \vdots & \ddots & \vdots & \vdots & \vdots & \ddots & \vdots & \ddots & \vdots & \vdots & \ddots & \vdots \\ 1 & x_m & \cdots & x_m^{d_1-1} & y_m & y_m x_m & \cdots & y_m x_m^{d_2-1} & \cdots & y_m^{r-1} & y_m^{r-1} x_m & \cdots & y_m^{r-1} x_m^{d_r-1} \end{pmatrix} \quad (7)$$

$$v := (h_{10}, h_{11}, \ldots h_{1,d_1-1} | h_{20}, h_{21}, \ldots h_{2,d_2-1} | \ldots | h_{r0}, h_{r1}, \ldots h_{r,d_r-1})^T \quad (8)$$

To find a nonzero element in the kernel of V, the following displacement structure for V can be determined:

$$\begin{pmatrix} 1/x_1 & 0 & \cdots & 0 \\ 0 & 1/x_2 & \cdots & 0 \\ \vdots & \vdots & \ddots & \vdots \\ 0 & 0 & \cdots & 1/x_m \end{pmatrix} \cdot V - V \cdot \begin{pmatrix} 0 & 1 & 0 & \cdots & 0 \\ 0 & 0 & 1 & \cdots & 0 \\ \vdots & \vdots & \vdots & \ddots & \vdots \\ 0 & 0 & 0 & \cdots & 1 \\ 0 & 0 & 0 & \cdots & 0 \end{pmatrix} = G \cdot B, \quad (9)$$

where G and B are the matrices defined in steps 32 and 33. Referring to FIG. 3, in step 35, vector v is transformed into polynomial h(x, y) where deg($h_i(x)$)<$d_i$ and $h(x_i, y_i)=0$ for i=1, . . . , m by $$\sum_{i=1}^{r} h_i(x) y^{i-1},$$

where $h_2(x) = v_1 + v_2 x + \ldots + v_{d_1} x^{d_1-1}$ $h_2(x) = v_{d_1+1} + v_{d_1+2} x + \ldots + v_{d_1+d_2} x^{d_2-1}$

.
.
.

$h_r(x) = v_{d_1+\ldots+d_{r-1}+1} + v_{d_1+\ldots+d_{r-1}+2} x + \ldots + v_{d_1+\ldots+d_{r-1}+d_r} x^{d_r-1}$. (10)

Referring to FIG. 2 in step 22, all polynomials f(x) of degree less than k with coefficients in GF(q) are computed such that h(x, f(x))=0 which can be determined, as described in S. Ar, R. Lipton, R. Rubinfeld, and M. Sudan, "Reconstructing Algebraic Functions from Mixed Data, In Proc. $33^{rd}$ FOCS, pages 503–512, 1992. In step 23, vectors $(f(x_1), \ldots, f(x_m))$ are output which differ from $(y_1, \ldots, y_m)$ in a predetermined number of positions. The predetermined number of positions can be $$\frac{m}{l-1} + \frac{lk}{2} - 1.$$

Figure 6:
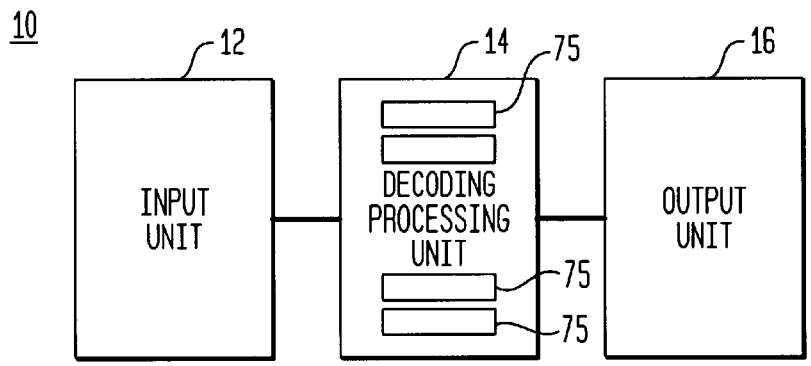
FIG. 6 is a schematic diagram of the configuration of an apparatus including parallel processing for decoding error correcting codes.

FIG. 6 represents a schematic diagram of an apparatus for error correction codes using parallel processors 70. Decoding processing unit 74 includes a number P of processors 75 that can access the same memory locations. Decoding of RS code C as described in steps 21–23 is performed with accounting for parallel processing as described below.

Figure 7:
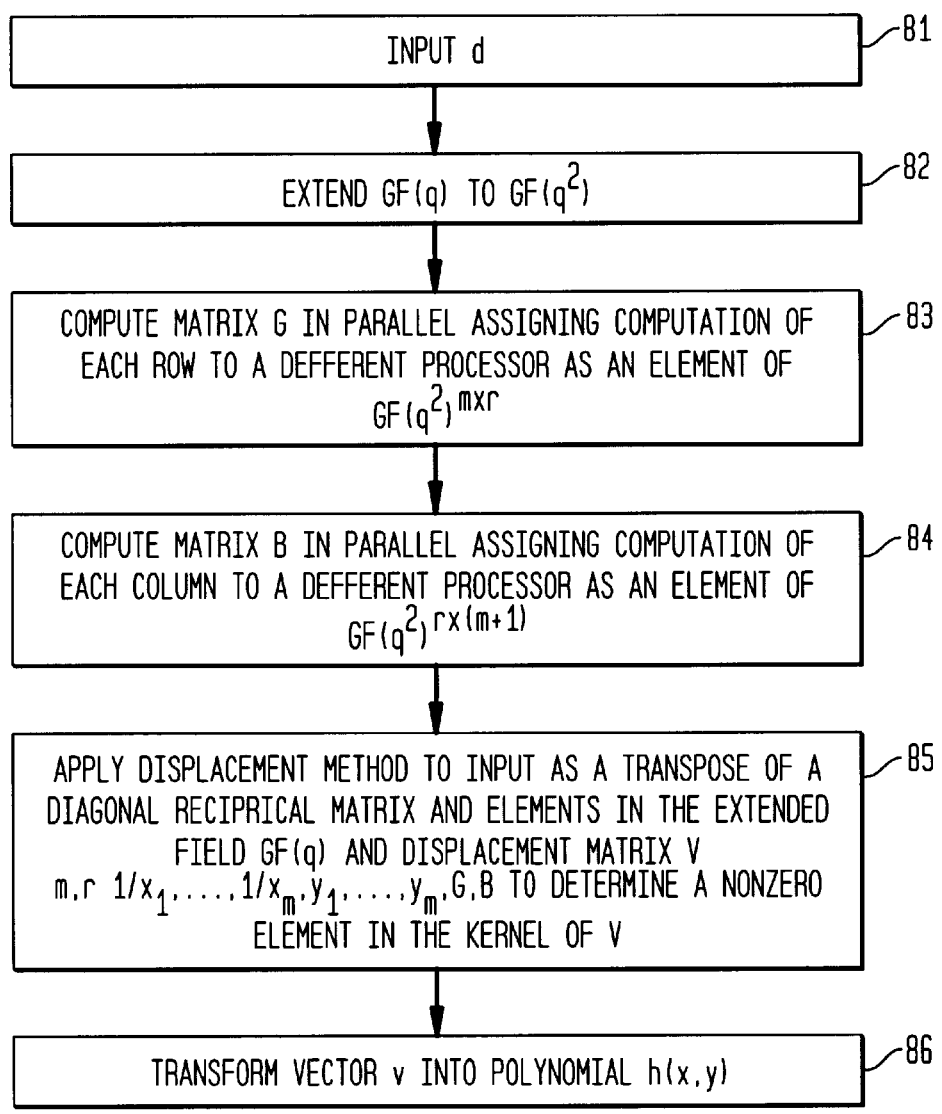
FIG. 7 is a flow chart illustrating a decoding procedure of a decoding processing unit in the apparatus of FIG. 6.

FIG. 7 illustrates a method for implementation of step 21 with parallel processors. In step 81, m different nonzero values $(z_1, \ldots, z_m)$ are chosen in GF(q) such that $z_i \neq 1/x_j$ for $i \neq j$. In step 82, if GF(q) does not contain these elements, GF(q) is extended to GF($q^2$).

In step 83, the matrix $G=(g_{ij})$ is computed in parallel assigning the computation of each row to a different processor as:

$$G = (g_{ij}) = \begin{pmatrix} 1/x_1 & y_1/x_1 - x_1^{d_1-1} & \ldots & y_1^{r-2}(y_1/x_1 - x_1^{d_{r-1}-1}) & -y_1^{r-1}x_1^{d_r-1} \\ 1/x_2 & y_2/x_2 - x_2^{d_1-1} & \ldots & y_2^{r-2}(y_2/x_2 - x_2^{d_{r-1}-1}) & -y_2^{r-1}x_2^{d_r-1} \\ \vdots & \vdots & \ddots & \vdots & \\ 1/x_m & y_m/x_m - x_2^{d_1-1} & \ldots & y_m^{r-2}(y_m/x_m - x_m^{d_{r-1}-1}) & -y_m^{r-1}x_m^{d_r-1} \end{pmatrix} \quad (11)$$

In step 84, the matrix B is determined from input $(x_1, \ldots, x_m)$ in $GF(q)$, positive integers $D_1 < D_2 < \ldots < D_{r-1}$, with $D_1 := d_1, D_2 := d_1 + d_2, \ldots, D_{r-1} := d_1 + \ldots + d_{r-1}$, and an integer m.

Matrix B is computed in parallel by assigning computation of each column to a different processor as $$B = \begin{pmatrix} 1 & 1 & \ldots & 1 & 1 \\ z_1^{D_1} & z_2^{D_1} & \ldots & z_m^{D_1} & 0 \\ \vdots & \vdots & \ddots & \vdots & \vdots \\ z_1^{D_{r-1}} & z_2^{D_{r-1}} & \ldots & z_m^{D_{r-1}} & 0 \\ z_1^m & z_2^m & \ldots & z_m^m & 0 \end{pmatrix} \quad (12)$$

In step 85, a displacement method is applied to input m, r, $1/x_1, \ldots, 1/x_{m_1}, z_1, z_2, \ldots, z_m$, G, B to determine vector V as output.

In general, the task of the displacement method is the following: if V is a matrix over the field $GF(q)$ having m rows and m+1 columns, given as the solution to the equation $$\underbrace{\begin{pmatrix} x_1 & 0 & \ldots & 0 \\ 0 & x_2 & \ldots & 0 \\ \vdots & \vdots & \ddots & \vdots \\ 0 & 0 & \ldots & x_m \end{pmatrix}}_{=D} \cdot V - V \cdot \underbrace{\begin{pmatrix} z_1 & 0 & 0 & \ldots & 0 & 0 \\ 0 & z_2 & 0 & \ldots & 0 & 0 \\ \vdots & \vdots & \vdots & \ddots & \vdots & \vdots \\ 0 & 0 & 0 & \ldots & z_m & 0 \\ 0 & 0 & 0 & \ldots & 0 & 0 \end{pmatrix}}_{=Z} = G \cdot B, \quad (13)$$

where the $x_i$, $z_j$ are pairwise different and nonzero elements of $GF(q)$ and $x_i \neq z_j$, for $i \neq j$, then a nonzero vector v is determined such that $V \cdot v = 0$.

The following space efficient variant can be used in the displacement matrix. The matrix $$\overline{V} := \begin{pmatrix} V \\ I \end{pmatrix},$$

where I is the $(m+1) \times (m+1)$-identity matrix, has the displacement structure $$\begin{pmatrix} D & 0 \\ 0 & Z \end{pmatrix} \cdot \overline{V} - \overline{V} \cdot Z = \begin{pmatrix} G \\ 0 \end{pmatrix} B \quad (14)$$

Applying the displacement method to $\overline{V}$ then recovers in an iterative fashion matrices $D_s, Z_s, C_s, G_s$, and $B_s$, $s = 0, 1, \ldots$, such that $$\begin{pmatrix} D_s & 0 \\ 0 & Z \end{pmatrix} \cdot \overline{V}_s - \overline{V}_s \cdot Z_s = \begin{pmatrix} G \\ 0 \end{pmatrix} B_s \quad (15)$$

where $\overline{V}_s$ is the Schur complement of the matrix $\overline{V}_{s-1}$ with respect to the (1,1)-entry. If $m_s$ denotes m-s, then $D_s \in GF(q)^{m_s \times m_s}$, $Z_s \in G(q)^{(m_s+1) \times (m_s+1)}$, $G_s \in GF(q)^{m_s \times r}$, and $B_s \in GF(q)^{r \times (m_s+1)}$.

FIG. 8 illustrates a flow diagram of displacement method 100 which can be used to determine a nonzero element in the kernel of matrix V. In step 101, input m, r, $1/x_1, \ldots, 1/x_m$, $z_1, \ldots, z_m$, G, B is applied. In step 102, an integer index s is set to zero. In step 103, a loop from k=1 to m is performed in parallel to determine vector $\tau_k$, representing a first column of the matrix. In step 104, it is determined if the first m-s entries are equal to zero. If the result of step 104 is affirmative then step 105 is performed and a nonzero vector $v \in GF(q)^{m+1}$ such that $V \cdot v = 0$ for the matrix V is outputted. The output vector v is given as $(c_{m-s+1}, \ldots, c_m, 1, 0, \ldots, 0)^T$, where $c_{m-s+1}, \ldots, c_m$ are entries m-s+1, \ldots, m of the first column of $\overline{V}_s$. If the result of step 104 is negative, pivoting is performed in step 106 to exchange the first entry with the first nonzero entry, among the first m-s entries of the first column, as represented as the $k^{th}$ entry whereon $1 \leq k \leq m-s$. This corresponds to a multiplication of $\overline{V}_s$ with a permutation matrix, which results in exchanging the first and the $k^{th}$ row of $G_s$.

To retain the above described displacement structure, the same permutation matrix is multiplied from the right, which results in exchanging the first and the $k^{th}$ column of $B_s$, to recover the matrices $G_{s+1}$ and $B_{s+1}$, the first row and the first column of $\overline{V}_s$ is computed in parallel in steps 107, 108 and 109. Steps 110 and 111 update the matrices $G_{s+1}$ and $B_{s+1}$ using the elimination step of the displacement approach. Step 112 updates $D_{s+1}$ and $Z_{s+1}$ by deleting their (1,1)-entry and returns to step 103.

Referring to FIG. 7, in step 85 the displacement structure is determined for $V \cdot W^T$ since matrix V does not have the needed displacement for the displacement method where W is $$W := \begin{pmatrix} 1 & z_1 & z_1^2 & \ldots & z_1^m \\ 1 & z_2 & z_2^2 & \ldots & z_2^m \\ 1 & z_3 & z_3^2 & \ldots & z_3^m \\ \vdots & \vdots & \vdots & \ddots & \vdots \\ 1 & z_m & z_m^2 & \ldots & z_m^m \\ 1 & 0 & 0 & \ldots & 0 \end{pmatrix} \quad (16)$$

Then a short calculation reveals the following displacement structure for $V \cdot W^T$:

$$\begin{pmatrix} 1/x_1 & 0 & \ldots & 0 \\ 0 & 1/x_2 & \ldots & 0 \\ \vdots & \vdots & \ddots & \vdots \\ 0 & 0 & \ldots & 1/x_m \end{pmatrix} \cdot V \cdot W^T - \quad (17)$$

-continued $$V \cdot W^T \cdot \begin{pmatrix} z_1 & 0 & \cdots & 0 & 0 \\ 0 & z_2 & \cdots & 0 & 0 \\ \vdots & \vdots & \ddots & \vdots & \vdots \\ 0 & 0 & \cdots & z_m & 0 \\ 0 & 0 & \cdots & 0 & 0 \end{pmatrix} = G \cdot B \quad (5)$$

Vector $w=(w_1, \ldots, w_{m+1}) \in GF(q)^{m+1}$ is determined from parallel matrix vector multiplication on m processors such that $$\begin{pmatrix} w_1 \\ w_2 \\ w_3 \\ \vdots \\ w_m \\ w_{m+1} \end{pmatrix} = \begin{pmatrix} 1 & 1 & 1 & \cdots & 1 & 1 \\ z_1 & z_2 & z_3 & \cdots & z_m & 0 \\ z_1^2 & z_2^2 & z_3^2 & \cdots & z_m^2 & 0 \\ \vdots & \vdots & \vdots & \ddots & \vdots & \vdots \\ z_1^m & z_2^m & z_3^m & \cdots & z_m^m & 0 \end{pmatrix} \cdot \begin{pmatrix} v_1 \\ v_2 \\ v_3 \\ \vdots \\ v_m \\ v_{m+1} \end{pmatrix}, \quad (18)$$

Vector v is determined as $W^T \cdot w$.

In step 86, the vector v is transformed into the polynomial $\Sigma_{f=1}^r h_f(x) y^{f-1}$ where $$h_r(x) := v_1 x^{d_r-1} + v_2 x^{d_r-2} + \ldots + v_{d_r-1} x + v_{d_r}$$

$$h_{r-1}(x) := v_{d_r+1} x^{d_{r-1}-1} + v_{d_r+2} x^{d_{r-1}-2} + \ldots + v_{d_r+d_{r-1}-1} x + v_{d_r+d_{r-1}}$$

$$\vdots$$

$$h_1(x) := v_{d_r+d_{r-1}+\ldots+d_2+1} x^{d_1-1} + v_{d_r+d_{r-1}+\ldots+d_2+2} x^{d_1-2} + \ldots + v_m x + v_{m+1} \quad (19)$$

In general, the present invention provides efficient list decoding of RS codes because the method runs in a time that is proportional to $l \cdot n^2$ where n is the length of the code and l is the target list size. The method is efficient in the presence of high noise levels as indicated by the assumption of a very large number of errors in the codes which are decoded.

It is to be understood that the above-described embodiments are illustrative of only a few of the many possible specific embodiments which can represent applications of the principles of the invention. Numerous and varied other arrangements can be readily devised in accordance with these principles by those skilled in the art without departing from the spirit and scope of the invention.

What is claimed is:

1. A decoding method for executing decoding processing to a received word represented by m dimensional vectors $(y_1, \ldots, y_m)$ of an error correction code applied to a message represented by a set of m points $x_1, \ldots, x_m$ in a Galois field comprising the steps of:

inputting a target list size l and a set of points $(x_1, y_1) \ldots (x_m, y_m)$ derived from said error correction code and from said received word;

constructing a polynomial by a displacement method from a nonzero element v determined from a displacement matrix;

computing roots of said polynomial;

determining a vector $v_i$ from said roots of said polynomial;

determining if said vector $v_i$ differs from $(y_1, \ldots, y_m)$ in at most a predetermined number of positions; and, outputting a list of candidate code words which satisfy the condition of the previous step.

2. The method of claim 1 wherein said error correcting code is a Reed Solomon code.

3. The method of claim 1 wherein said predetermined number of positions is $$\frac{lm}{l+1} - \frac{lk}{2} - 1,$$

wherein $1 \leq k \leq m-1$.

4. The method of claim 1 wherein said displacement matrix is determined by the steps of:

computing a matrix G as an element of the Galois field represented by $GF(q)^{m \times r}$, where r is l+1;

computing a matrix B as an element of the Galois field represented by $GF(q)^{r \times (m+1)}$;

determining said displacement matrix as a matrix V based on said matrix G and said matrix B; and determining said nonzero element v in a kernel of said displacement matrix V.

5. The method of claim 4 wherein said matrix B is represented by:

$$B = \begin{pmatrix} \begin{array}{cccc|cccc} 1 & 0 & 0 & \cdots & 0 & 0 & 0 & 0 & \cdots & 0 \\ 0 & 0 & 0 & \cdots & 0 & 1 & 0 & 0 & \cdots & 0 \\ 0 & 0 & 0 & \cdots & 0 & 0 & 0 & 0 & \cdots & 0 \\ \vdots & \vdots & \vdots & \ddots & \vdots & \vdots & \vdots & \vdots & \ddots & \vdots \\ 0 & 0 & 0 & \cdots & 0 & 0 & 0 & 0 & \cdots & 0 \\ 0 & 0 & 0 & \cdots & 0 & 0 & 0 & 0 & \cdots & 0 \\ \hline & & d_1 & & & & & d_2 & & \end{array} \\ \cdots \begin{array}{cccc|cccc} 0 & 0 & 0 & \cdots & 0 & 0 & 0 & 0 & \cdots & 0 \\ 0 & 0 & 0 & \cdots & 0 & 0 & 0 & 0 & \cdots & 0 \\ 0 & 0 & 0 & \cdots & 0 & 0 & 0 & 0 & \cdots & 0 \\ \vdots & \vdots & \vdots & \ddots & \vdots & \vdots & \vdots & \vdots & \ddots & \vdots \\ 1 & 0 & 0 & \cdots & 0 & 0 & 0 & 0 & \cdots & 0 \\ 0 & 0 & 0 & \cdots & 0 & 1 & 0 & 0 & \cdots & 0 \\ \hline & & d_{r-1} & & & & & d_r & & \end{array} \end{pmatrix}.$$

6. The method of claim 5 wherein said matrix G is represented by:

$$G = (g_{ij}) = \begin{pmatrix} 1/x_1 & y_1/x_1 - x_1^{d_1-1} & \cdots & y_1^{r-2}(y_1/x_1 - x_1^{d_{r-1}-1}) \\ 1/x_2 & y_2/x_2 - x_2^{d_1-1} & \cdots & y_2^{r-2}(y_2/x_2 - x_2^{d_{r-1}-1}) \\ \vdots & \vdots & \ddots & \vdots \\ 1/x_m & y_m/x_m - x_m^{d_1-1} & \cdots & y_m^{r-2}(y_m/x_m - x_m^{d_{r-1}-1}) \end{pmatrix}.$$

7. The method of claim 6 wherein said displacement matrix V is determined from the solution of the equation:

$$\underbrace{\begin{pmatrix} x_1 & 0 & \cdots & 0 \\ 0 & x_2 & \cdots & 0 \\ \vdots & \vdots & \ddots & \vdots \\ 0 & 0 & \cdots & x_m \end{pmatrix}}_{=D} \cdot V - V \cdot \underbrace{\begin{pmatrix} 0 & 1 & 0 & \cdots & 0 \\ 0 & 0 & 1 & \cdots & 0 \\ \vdots & \vdots & \vdots & \ddots & \vdots \\ 0 & 0 & 0 & \cdots & 1 \\ 0 & 0 & 0 & \cdots & 0 \end{pmatrix}}_{=Z} = G \cdot B.$$

8. The method of claim 7 wherein said step of determining a nonzero element v in a kernel of said displacement matrix V comprises the steps of:

(a) inputting m, r, $x_1, \ldots, x_m, y_1, \ldots, y_m$, G, B;

(b) setting an integer index s to zero;

(c) performing a loop from k=1 to m for determining a first column of a Schur complement of said displacement matrix V;

(d) if any of the first m−s entries of said first column are not equal to zero, exchanging a first entry with a first nonzero entry among the first m−s entries in said first column;

(e) computing a first row and first column of said Schur complement;

(f) updating matrices $G_{s+1}$ and $G_{s+1}$, by deleting a (1,1) entry; and (g) repeating steps c–e until the first m−s entries of the first column of the Schur complement are zero.

9. The method of claim 8 wherein said polynomial is represented by h(x,y) as $\Sigma_{i=1}^{r} h_i(x)y^{i-1}$, wherein said vector $v_i$ is represented by $(v_1, \ldots, v_m, v_{m+1})$ and nonzero integers $d_1, d_2, \ldots, d_r$ such that $\Sigma_{i=1}^{r} d_i = m+1$ where $$h_1(x) = v_1 + v_2 x + \ldots + v_{d_1} x^{d_1 - 1}$$

$$h_2(x) = v_{d_1+1} + v_{d_1+2} x + \ldots + v_{d_1+d_2} x^{d_2 - 1}$$

.
.
.

$$h_r(x) = v_{d_1 + \ldots + d_{r-1} + 1} + v_{d_1 + \ldots + d_{r-1} + 2} x + \ldots + v_{d_1 + \ldots + d_{r-1} + d_r} x^{d_r - 1}.$$

10. A decoding method for executing decoding processing to a received word in parallel to an error correction code represented by m dimensional vectors $(y_1, \ldots, y_m)$ of an error correction code applied to a message represented by a set of m points $(x_1, \ldots, x_m)$ in a Galois field comprising the steps of:

inputting a target list size t and a set of points $(x_1, y_1) \ldots (x_m, y_m)$ derived from said error correction code and said received word;

constructing a polynomial by a displacement method executed in parallel from a nonzero element v determined from a displacement matrix;

computing roots of said polynomial;

determining a vector $v_i$ from said roots of said polynomial;

determining if said vector $v_i$ differs from $(y_1, \ldots, y_m)$ in at most a predetermined number of positions; and outputting a list of candidate code words which satisfy the condition of the previous step.

11. The method of claim 10 wherein said error correcting code is a Reed Solomon code.

12. The method of claim 10 wherein said predetermined number of positions is $$\frac{lm}{l+1} - \frac{lk}{2} - 1,$$

wherein $1 \leq k \leq m-1$.

13. The method of claim 10 wherein said displacement matrix is determined by the steps of:

choosing m different nonzero extended values $z_i, \ldots, z_m$ such that $z_i \neq 1/x_j$ for $i \neq j$ in $GF(q^2)$;

computing in parallel a matrix G of $GF(q^2)^{m \times r}$ by assigning computation of each column to a different parallel processor, where r is l+1;

computing in parallel a matrix B from said nonzero extended values as an element of $GF(q^2)^{r \times (m+1)}$ by assigning each row to a different parallel processor;

determining said displacement matrix as a matrix V based on said matrix G and said matrix B and a multiplication of a transpose of a diagonal matrix represented by $W^T$; and determining said nonzero element in a kernel of said displacement matrix V.

14. The method of claim 13 wherein said matrix B is represented by:

$$B = \begin{pmatrix} 1 & 1 & \ldots & 1 & 1 \\ z_1^{D_1} & z_2^{D_1} & \ldots & z_m^{D_1} & 0 \\ \vdots & \vdots & \ddots & \vdots & \vdots \\ z_1^{D_{r-1}} & z_2^{D_{r-2}} & \ldots & z_m^{D_{r-1}} & 0 \\ z_1^m & z_2^m & \ldots & z_m^m & 0 \end{pmatrix}$$

for positive integers $D_1 < D_2 < \ldots < D_{r-1}$ with integers $d_1, d_2, \ldots, d_r$ such that $\Sigma_{i=1}^{r} d_i = m+1$ and $D_1 = d_1, D_2 = d_1 + d_2, \ldots, D_{r-1} = d_1 + \ldots + d_{r-1}$.

15. The method of claim 14 wherein said matrix G is represented by $$G = (g_{ij}) =$$

$$\begin{pmatrix} 1/x_1 & y_1/x_1 - x_1^{d_1-1} & \ldots & y_1^{r-2}(y_1/x_1 - x_1^{d_{r-1}-1}) & -y_1^{r-1} x_1^{d_r-1} \\ 1/x_2 & y_2/x_2 - x_2^{d_1-1} & \ldots & y_2^{r-2}(y_2/x_2 - x_2^{d_{r-1}-1}) & -y_2^{r-1} x_2^{d_r-1} \\ \vdots & \vdots & \ddots & \vdots & \vdots \\ 1/x_m & y_m/x_m - x_m^{d_1-1} & \ldots & y_m^{r-2}(y_m/x_m - x_m^{d_{r-1}-1}) & -y_m^{r-1} x_m^{d_r-1} \end{pmatrix}.$$

16. The method of claim 15 wherein said displacement matrix V is determined as from the solution of the equation:

$$\begin{pmatrix} 1/x_1 & 0 & \cdots & 0 \\ 0 & 1/x_2 & \cdots & 0 \\ \vdots & \vdots & \ddots & \vdots \\ 0 & 0 & \cdots & 1/x_m \end{pmatrix} \cdot V \cdot W^T - V \cdot W^T \cdot \begin{pmatrix} z_1 & 0 & \cdots & 0 & 0 \\ 0 & z_2 & \cdots & 0 & 0 \\ \vdots & \vdots & \ddots & \vdots & \vdots \\ 0 & 0 & \cdots & z_m & 0 \\ 0 & 0 & \cdots & 0 & 0 \end{pmatrix} = G \cdot B$$

where W is $$W := \begin{pmatrix} 1 & z_1 & z_1^2 & \cdots & z_1^m \\ 1 & z_2 & z_2^2 & \cdots & z_2^m \\ 1 & z_3 & z_3^2 & \cdots & z_3^m \\ \vdots & \vdots & \vdots & \ddots & \vdots \\ 1 & z_m & z_m^2 & \cdots & z_m^m \\ 1 & 0 & 0 & \cdots & 0 \end{pmatrix}.$$

17. The method of claim 16 wherein vector v is determined as $W^T \cdot w$ where w is determined by parallel multiplication on m processors such that $$\begin{pmatrix} w_1 \\ w_2 \\ w_3 \\ \vdots \\ w_m \\ w_{m+1} \end{pmatrix} = \begin{pmatrix} 1 & 1 & 1 & \ldots & 1 & 1 \\ z_1 & z_2 & z_3 & \ldots & z_m & 0 \\ z_1^2 & z_2^2 & z_3^2 & \ldots & z_m^2 & 0 \\ \vdots & \vdots & \vdots & \ddots & \vdots & \vdots \\ z_1^m & z_2^m & z_3^m & \ldots & z_m^m & 0 \end{pmatrix} \cdot \begin{pmatrix} v_1 \\ v_2 \\ v_3 \\ \vdots \\ v_m \\ v_{m+1} \end{pmatrix}$$

wherein said vector $v_i$ is represented by $(v_1, \ldots, v_m, v_{m+1})$.

18. The method of claim 17 wherein said step of determining a nonzero element v in a kernel of said displacement matrix V comprises the steps of:
   (a) inputting m, r, $x_1, \ldots, x_m, y_1, \ldots, y_m$, G, B;
   (b) setting an integer index s to zero;
   (c) performing a loop from k=1 to m for determining a first column of a Schur complement of said matrix V;
   (d) if any of the first m−s entries of said first column and not equal to zero, exchanging a first entry with a first nonzero entry among the first m−s entries in said first column;
   (e) computing a first row and first column of said Schur complement;
   (f) updating matrices $B_{s+1}$ and $G_{s+1}$, by deleting a (1,1) entry; and
   (g) repeating steps c–e until the first m−s entries of the first column of the Schur complement are zero.

19. A decoding apparatus for executing decoding processing to a received word represented by m dimensional vectors $(y_1, \ldots, y_m)$ of an error correction code applied to a message represented by a set of m points $(x_1, \ldots, x_m)$ in a Galois field comprising:
   means for inputting a target list size s and a set of points $(x_1, y_1) \ldots (x_m, y_m)$ derived from said error correction code and from said received word;
   means for constructing a polynomial by a displacement method from a nonzero element v determined from a displacement matrix;
   means for computing roots of said polynomial;
   means for determining a vector $v_i$ from said roots of said polynomial;
   means for determining if said vector $v_i$ differs from $(y_1, \ldots, y_m)$ in a predetermined number of positions; and
   means for outputting a list of candidate code words which satisfy the condition of said vector $v_i$ differing from $(y_1, \ldots, y_m)$ in a predetermined number of positions.

20. The apparatus of claim 19 wherein said error correcting code is a Reed Solomon code.

21. The apparatus of claim 19 wherein said predetermined number of positions is $$\frac{lm}{l+1} - \frac{lk}{2} - 1,$$

wherein $1 \leq k \leq m-1$.

22. The apparatus of claim 19 wherein said displacement matrix is determined by:
   means for computing a matrix G of the Galois field represented by $GF(q)^{m \times r}$, where r is l+1;
   means for computing a matrix B as an element of the Galois field represented by $GF(q)^{r \times (m+1)}$;
   means for determining said displacement matrix as a matrix V based on said matrix G and said matrix B; and
   means for determining said nonzero element v in a kernel of said displacement matrix V.

23. The apparatus of claim 22 wherein said matrix B is represented by:

$$B = \begin{pmatrix} 1 & 0 & 0 & \ldots & 0 & 0 & 0 & 0 & \ldots & 0 \\ 0 & 0 & 0 & \ldots & 0 & 1 & 0 & 0 & \ldots & 0 \\ 0 & 0 & 0 & \ldots & 0 & 0 & 0 & 0 & \ldots & 0 \\ \vdots & \vdots & \vdots & \ddots & \vdots & \vdots & \vdots & \vdots & \ddots & \vdots \\ 0 & 0 & 0 & \ldots & 0 & 0 & 0 & 0 & \ldots & 0 \\ 0 & 0 & 0 & \ldots & 0 & 0 & 0 & 0 & \ldots & 0 \\ \underbrace{\phantom{xxxxxxxx}}_{d_1} & & \underbrace{\phantom{xxxxxxxx}}_{d_2} & \end{pmatrix}$$

$$\cdots \begin{pmatrix} 0 & 0 & 0 & \ldots & 0 & 0 & 0 & 0 & \ldots & 0 \\ 0 & 0 & 0 & \ldots & 0 & 0 & 0 & 0 & \ldots & 0 \\ 0 & 0 & 0 & \ldots & 0 & 0 & 0 & 0 & \ldots & 0 \\ \vdots & \vdots & \vdots & \ddots & \vdots & \vdots & \vdots & \vdots & \ddots & \vdots \\ 1 & 0 & 0 & \ldots & 0 & 0 & 0 & 0 & \ldots & 0 \\ 0 & 0 & 0 & \ldots & 0 & 1 & 0 & 0 & \ldots & 0 \\ \underbrace{\phantom{xxxxxxxx}}_{d_{r-1}} & & \underbrace{\phantom{xxxxxxxx}}_{d_r} & \end{pmatrix}.$$

24. The apparatus of claim 23 wherein said matrix G is represented by:

$$G = (g_{ij}) = \begin{pmatrix} 1/x_1 & y_1/x_1 - x_1^{d_1-1} & \ldots & y_1^{r-2}(y_1/x_1 - x_1^{d_{r-1}-1}) \\ 1/x_2 & y_2/x_2 - x_2^{d_1-1} & \ldots & y_2^{r-2}(y_2/x_2 - x_2^{d_{r-1}-1}) \\ \vdots & \vdots & \ddots & \vdots \\ 1/x_m & y_m/x_m - x_m^{d_1-1} & \ldots & y_m^{r-2}(y_m/x_m - x_m^{d_{r-1}-1}) \end{pmatrix}.$$

25. The apparatus of claim 24 wherein said displacement matrix V is determined from the solution to the equation:

$$\underbrace{\begin{pmatrix} x_1 & 0 & \ldots & 0 \\ 0 & x_2 & \ldots & 0 \\ \vdots & \vdots & \ddots & \vdots \\ 0 & 0 & \ldots & x_m \end{pmatrix}}_{=D} \cdot V - V \cdot \underbrace{\begin{pmatrix} 0 & 1 & 0 & \ldots & 0 \\ 0 & 0 & 1 & \ldots & 0 \\ \vdots & \vdots & \vdots & \ddots & \vdots \\ 0 & 0 & 0 & \ldots & 1 \\ 0 & 0 & 0 & \ldots & 0 \end{pmatrix}}_{=Z} = G \cdot B.$$

26. The apparatus of claim 25 wherein said means for determining a nonzero element v in a kernel of said displacement matrix v comprises the steps of:
   (a) means for inputting m, r, $x_1, \ldots, x_m, z_i, \ldots, z_m$, G, B;
   (b) means for setting integer index s to zero;
   (c) means for performing a loop from k=1 to m for determining a first column of a Schur complement of matrix V;
   (d) means for exchanging a first entry with a first nonzero entry among the first m−s entries in said first column if any of the first m−s entries of said first column are not equal to zero;
   (e) means for computing a first row and first column of said Schur complement;
   (f) means for updating matrices $G_{s+1}$ and $G_{s+1}$, by deleting a (1,1) entry; until the first m−s entries of the first column of the Schur complement are zero.

27. The apparatus of claim 26 wherein said polynomial is represented by $h(x,y)$ as $\Sigma_{i=1}^{r} h_i(x)y^{i-1}$, wherein said vector $v_i$ is represented by $(v_1, \ldots, v_m, v_{m+1})$ and nonzero integers $d_1, d_2, \ldots, d_r$ such that $\Sigma_{i=1}^r d_i = m+1$ where $$h_1(x) = v_1 + v_2 x + \ldots + v_{d_1} x^{d_1-1}$$

$$h_2(x) = v_{d_1+1} + v_{d_1+2} x + \ldots + v_{d_1+d_2} x^{d_2-1}$$

.

.

.

$$h_r(x) = v_{d_1+\ldots+d_{r-1}+1} + v_{d_1+\ldots+d_{r-1}+2} x + \ldots + v_{d_1+\ldots+d_{r-1}+\ldots+d_r} x^{d_r-1}.$$

28. A decoding apparatus for executing decoding processing in parallel to a received word represented by m dimensional vectors $(y_1, \ldots, y_m)$ of an error correction code applied to a message represented by a set of m points $(x_1, \ldots, x_m)$ in a Galois field comprising:

means for inputting a target list size t and a set of points $(x_1, y_1) \ldots (x_m, y_m)$ derived from said error correction code and said received word;

means for constructing a polynomial by a displacement method executed in parallel from a nonzero element v determined from a displacement matrix;

means for computing roots of said polynomial;

means for determining a vector $v_i$ from said roots of said polynomial;

means for determining if said vector $v_i$ differs from $(y_1, \ldots, y_m)$ in at most a predetermined number of positions; and means for outputting a list of candidate code words which satisfy the condition of said vector $v_i$ differing from $(y_1, \ldots, y_m)$ in a predetermined number of positions.

29. The apparatus of claim 28 wherein said error correcting code is a Reed Solomon code.

30. The apparatus of claim 28 wherein said predetermined number of positions is $$\frac{lm}{l+1} - \frac{lk}{2} - 1,$$

wherein $1 \leq k \leq m-1$.

31. The apparatus of claim 28 wherein said means for constructing a polynomial comprises:

means for choosing m different nonzero extended values $z_1, \ldots, z_m$ such that $z_i \neq 1/x_j$ for $i \neq j$ in $GF(q^2)$;

means for computing in parallel a matrix G of $GF(q^2)^{m \times r}$ by assigning computation of each column to a different parallel processor, where r is l+1;

means for computing in parallel a matrix B from said nonzero extended values as an element of $GF(q^2)^{r \times (m+1)}$ by assigning each row to a different parallel processor;

means for determining said displacement matrix as a matrix V based on said matrix G and said matrix B and a multiplication of a transpose of a matrix represented by $W^T$; and means for determining a nonzero element in a kernel of said displacement matrix V.

32. The apparatus of claim 31 wherein said matrix B is represented by:

$$B = \begin{pmatrix} 1 & 1 & \ldots & 1 & 1 \\ z_1^{D_1} & z_2^{D_1} & \ldots & z_m^{D_1} & 0 \\ \vdots & \vdots & \ddots & \vdots & \vdots \\ z_1^{D_{r-1}} & z_2^{D_{r-1}} & \ldots & z_m^{D_{r-1}} & 0 \\ z_1^m & z_2^m & \ldots & z_m^m & 0 \end{pmatrix}$$

for positive integers $D_1 < D_2 < \ldots < D_{r-1}$ with integers $d_1, d_2, \ldots, d_r$ such that $\Sigma_{i=1}^r d_i = m+1$ and $D_1 = d_1, D_2 = d_1 + d_2, \ldots, D_{r-1} = d_1 + \ldots + d_{r-1}$.

33. The apparatus of claim 32 wherein said matrix G is represented by $$G = (g_{ij}) =$$

$$\begin{pmatrix} 1/x_1 & y_1/x_1 - x_1^{d_1-1} & \ldots & y_1^{r-2}(y_1/x_1 - x_1^{d_{r-1}-1}) & -y_1^{r-1} x_1^{d_r-1} \\ 1/x_2 & y_2/x_2 - x_2^{d_1-1} & \ldots & y_2^{r-2}(y_2/x_2 - x_2^{d_{r-1}-1}) & -y_2^{r-1} x_2^{d_r-1} \\ \vdots & \vdots & \ddots & \vdots & \vdots \\ 1/x_m & y_m/x_m - x_m^{d_1-1} & \ldots & y_m^{r-2}(y_m/x_m - x_m^{d_{r-1}-1}) & -y_m^{r-1} x_m^{d_r-1} \end{pmatrix}.$$

34. The apparatus of claim 33 wherein said displacement matrix V is determined as from the solution of the equation:

$$\begin{pmatrix} 1/x_1 & 0 & \ldots & 0 \\ 0 & 1/x_2 & \ldots & 0 \\ \vdots & \vdots & \ddots & \vdots \\ 0 & 0 & \ldots & 1/x_m \end{pmatrix} \cdot V \cdot W^T - V \cdot W^T \cdot \begin{pmatrix} z_1 & 0 & \ldots & 0 & 0 \\ 0 & z_2 & \ldots & 0 & 0 \\ \vdots & \vdots & \ddots & \vdots & \vdots \\ 0 & 0 & \ldots & z_m & 0 \\ 0 & 0 & \ldots & 0 & 0 \end{pmatrix} = G \cdot B$$

where W is $$W := \begin{pmatrix} 1 & z_1 & z_1^2 & \cdots & z_1^m \\ 1 & z_2 & z_2^2 & \cdots & z_2^m \\ 1 & z_3 & z_3^2 & \cdots & z_3^m \\ \vdots & \vdots & \vdots & \ddots & \vdots \\ 1 & z_m & z_m^2 & \cdots & z_m^m \\ 1 & 0 & 0 & \cdots & 0 \end{pmatrix}.$$

35. The apparatus of claim 34 wherein vector v is determined as $W^T \cdot w$ where w is determined by parallel multiplication on m processors such that $$\begin{pmatrix} w_1 \\ w_2 \\ w_3 \\ \vdots \\ w_m \\ w_{m+1} \end{pmatrix} = \begin{pmatrix} 1 & 1 & 1 & \ldots & 1 & 1 \\ z_1 & z_2 & z_3 & \ldots & z_m & 0 \\ z_1^2 & z_2^2 & z_3^2 & \ldots & z_m^2 & 0 \\ \vdots & \vdots & \vdots & \ddots & \vdots & \vdots \\ z_1^m & z_2^m & z_3^m & \ldots & z_m^m & 0 \end{pmatrix} \cdot \begin{pmatrix} v_1 \\ v_2 \\ v_3 \\ \vdots \\ v_m \\ v_{m+1} \end{pmatrix}$$

wherein said vector $v_i$ is represented by $(v_1, \ldots, v_{m+1})$.

36. The apparatus of claim 35 wherein said means for determining a nonzero element v in a kernel of said displacement matrix V comprises:

(a) means for inputting m, r, $x_1, \ldots, x_m, y_1, \ldots, y_m$, G, B;

(b) means for setting an integer index s to zero;

(c) means for performing a loop from k=1 to m for determining a first column of a Schur complement of matrix V;
(d) means for exchanging a first entry with a first nonzero entry among the first m−s entries in said first column if any of the first m−s entries of said first column and not equal to zero;
(e) means for computing a first row and first column of said Schur complement; and
(f) means for updating matrices $G_{s+1}$ and $G_{s+1}$, by deleting a (1,1) entry until the first m−s entries of the first column of the Schur complement are zero.

* * * * *